United States Patent [19]
Glennon

[11] Patent Number: 6,037,752
[45] Date of Patent: Mar. 14, 2000

[54] FAULT TOLERANT STARTING/ GENERATING SYSTEM

[75] Inventor: Timothy F. Glennon, Rockford, Ill.

[73] Assignee: Hamilton Sundstrand Corporation, Rockford, Ill.

[21] Appl. No.: 08/884,748

[22] Filed: Jun. 30, 1997

[51] Int. Cl.[7] .................................. H02P 9/04; H02J 3/00
[52] U.S. Cl. .............................................. 322/22; 307/19
[58] Field of Search ................................... 290/4 C, 4 D, 290/31, 36 R, 38 R, 47; 322/7, 9, 22, 23, 24; 307/19

[56] References Cited

U.S. PATENT DOCUMENTS

| | | | |
|---|---|---|---|
| 2,908,776 | 10/1959 | Nolden et al. | 200/4 |
| 3,132,297 | 5/1964 | Erikson | 322/59 |
| 3,519,843 | 7/1970 | Trautman | 307/65 |
| 3,555,290 | 1/1971 | Ellermeyer | 306/65 |
| 4,356,402 | 10/1982 | Morimoto et al. | 307/19 |
| 4,403,292 | 9/1983 | Ejzak et al. | 364/492 |
| 4,456,830 | 6/1984 | Cronin | 290/27 |
| 4,467,220 | 8/1984 | Page | 307/19 |
| 4,638,175 | 1/1987 | Bradford et al. | 307/64 |
| 4,659,942 | 4/1987 | Volp | 307/19 |
| 4,743,776 | 5/1988 | Baehler et al. | 290/31 |
| 4,786,852 | 11/1988 | Cook | 322/10 |
| 4,830,412 | 5/1989 | Raad et al. | 290/31 |
| 4,862,342 | 8/1989 | Dhyanchand et al. | 363/40 |
| 4,967,096 | 10/1990 | Diemer et al. | 307/19 |
| 5,012,177 | 4/1991 | Dhyanchand et al. | 322/10 |
| 5,036,267 | 7/1991 | Markunas et al. | 322/10 |
| 5,055,764 | 10/1991 | Rozman et al. | 322/10 |
| 5,266,838 | 11/1993 | Gerner | 307/19 |
| 5,309,081 | 5/1994 | Shah et al. | 322/10 |
| 5,691,625 | 11/1997 | Kumar et al. | 322/20 |

FOREIGN PATENT DOCUMENTS

WO90/08893  8/1990  WIPO.

OTHER PUBLICATIONS

PCT Search Report for International Application No.: PCT/US98/11249.

Primary Examiner—Nicholas Ponomarenko
Attorney, Agent, or Firm—Marshall O'Toole Gerstein Murray & Borun

[57] ABSTRACT

A power conversion system allows for redundant starting and generating functions together with fault tolerant operation through the multiple use of power conversion equipment.

20 Claims, 7 Drawing Sheets

FAULT TOLERANT STARTING/ GENERATING SYSTEM

TECHNICAL FIELD

The present invention relates generally to starting/ generating systems, and more particularly to a starting/ generating system for an aircraft.

BACKGROUND ART

In modern aircraft, a number of aircraft engines are provided, as well as an auxiliary power unit (APU). Conventionally, the main engines are started by air turbine starters, requiring valves, ducts, and other equipment in the tightly packed engine nacelle. Further, the APU is typically started by a DC machine which only provides a useful function for a very short period of time over each APU engine cycle. Also, the starter motor is a high maintenance item owing to the use of brushes therein.

Of late, more electric aircraft have been studied whereby central hydraulic and pneumatic systems are removed and electric power is utilized to start engines, provide air conditioning as well as cabin pressurization and fresh air flow, retract landing gear provide local hydraulic centers, and provide some forms of de-icing. Additionally, variable frequency power generation capability has been proposed for loads, as opposed to the traditional matching of power conversion to the loads, i.e., fixed frequency 400 Hz. and/or motor drives. Coupled with this is the need for fault tolerance and minimum, yet sufficient, redundancy.

When the power ratings of generators coupled to the engines become sufficient, main engine electric start becomes an option. This capability allows significant amounts of equipment to be removed from the aircraft, particularly in tightly packed areas, such as the engine nacelle.

SUMMARY OF INVENTION

A starting/generating system allows for redundant starting and generating functions and eliminates equipment normally found in a conventional system so that size and weight are reduced.

More particularly, according to one aspect of the present invention, a power conversion system includes first and second prime movers, first and second pairs of generators coupled to the first and second prime movers, respectively, a load bus and a power source. A power converter interconnects the generators, the load bus and the power source whereby power from the power source is conditioned and supplied during operation in a starting mode to one of the generators of the first pair of generators to cause the one generator to operate as a motor and start the first prime mover. Power is subsequently provided to a generator of the second pair of generators to cause such generators to operate as a motor and thereby start the second prime mover.

In alternative embodiments, power for the generator of the second pair of generators is developed either by the one generator of the first pair of generators or by the power source.

Preferably, the power converter is further operable in a generating mode to condition power developed by at least one of the generators and to deliver such conditioned power to the load bus.

Still further in accordance with the preferred embodiment, the prime movers comprise aircraft engines. In accordance with alternative embodiments, the power source comprises a battery for APU starting or an external AC power source which can be 400 Hz. or 50/60 Hz.

In addition, the load bus preferably receives variable frequency power from at least one of the generators.

In accordance with a highly preferred embodiment, the power converter comprises a plurality of identical power converter units and the power conversion system further includes additional load buses, a first switch matrix coupled between the generators and the power converter units and a second switch matrix coupled between the power converter units and the load buses. Each power converter unit preferably comprises a rectifier circuit coupled between the first switch matrix and a DC link and an inverter coupled between the DC link and the second switch matrix.

Each of the first and second switch matrices may comprise a rotary device including a housing having a plurality of sets of housing contacts and a rotor having a set of rotor contacts selectively engageable with one of the sets of housing contacts.

According to an alternative aspect of the present invention, a power conversion system for an aircraft includes first and second aircraft engines, an auxiliary power unit (APU) and first and second pairs of generators coupled to the first and second aircraft engines, respectively, and a third pair of generators coupled to the APU. A first load bus is coupled to an electrically driven hydraulic pump and the system further includes a second, variable frequency bus. A first switch matrix is coupled to the generators and first through sixth power converter units are coupled to the first switch matrix. A second switch matrix is coupled between the first through sixth power converter units and the load buses and a control is operable in a starting mode to cause at least one of the power converter units to provide conditioned power to at least one of the generators to cause the at least one generator to operate as a motor and start the APU or aircraft engine coupled thereto. The control is subsequently operable to cause the at least one of the power converter units to provide power selectively to each of the remaining generators to cause the remaining generator to operate as a motor and thereby start the APU and/or aircraft engine thereto. The control is still further operable in a generating mode to provide power developed by one or more of the generators to the load buses.

In accordance with yet another aspect of the present invention, a power conversion system is provided in an aircraft having first and second pairs of generators coupled to first and second aircraft engines, respectively, and a third pair of generators coupled to an APU. The aircraft further includes a first set of load buses coupled to electrically driven hydraulic pumps, a second set of load buses coupled to variable frequency loads and a DC bus coupled to the DC loads. The power conversion system includes a first switch matrix coupled to the generators and identical first through sixth power converter units coupled to the first switch matrix. A second switch matrix is coupled between the first through sixth power converter units and the first and second sets of load buses. A control is provided for controlling the first and second switch matrices and the power converter units and is operable in a starting mode to cause at least one of the power converter units to provide conditioned power to one of the generators to cause the one generator to operate as a motor and start the APU or the aircraft engine coupled thereto. The control is subsequently operable to cause the at least one of the power converter units to provide power developed by the one generator selectively to each of the remaining generators to cause the remaining generators to operate as motors and thereby start the APU and/or aircraft engines coupled thereto. The control is still further operable in a generating mode to provide conditioned AC power to the first set of load buses, variable frequency AC power to the second set of load buses and DC power to the DC bus. Each power converter unit comprises a rectifier circuit coupled between the first switch matrix and a DC link and an inverter coupled between the DC link and the second switch matrix.

Other aspects and advantages of the present invention will become apparent upon consideration of the following drawings and detailed description.

DESCRIPTION OF THE PREFERRED EMBODIMENT

Figure 1:
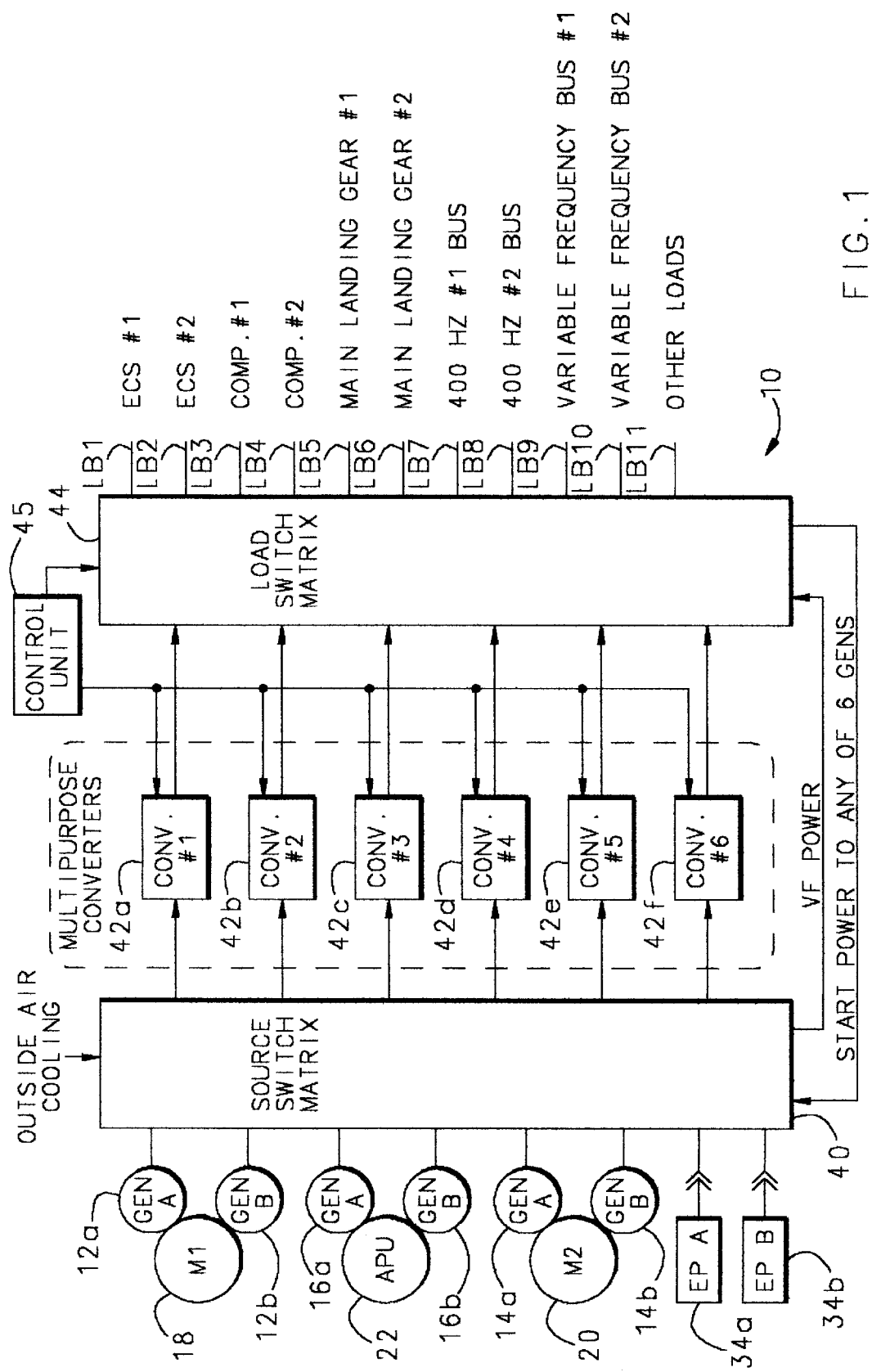
FIG. 1 comprises a block diagram of a power conversion system according to the present invention.

Referring now to FIG. 1, an aircraft power conversion system 10 according to the present invention provides electric power produced by first through third pairs of generators 12a, 12b and 14a, 14b and 16a, 16b driven by a first aircraft engine 18, a second aircraft engine 20 and an auxiliary engine power unit (APU) 22, respectively, to various loads directly or indirectly through power converters. The loads are connected to a plurality of load buses LB1–LB11. Load buses LB1 and LB2 may supply power to environmental control system loads (such as air conditioning apparatus) whereas load buses LB3 and LB4 may supply power to compressors for cabin pressurization. Load buses LB5 and LB6 may supply power to left and right main landing gear, whereas load buses LB7–LB10 may provide fixed frequency 400 Hz. and variable frequency power to various loads. Load bus LB11 may supply power to other loads, as required.

The generators 12, 14 and 16, may, for example, have 200 kw power ratings. The APU 22 may drive the generators 16a, 16b at a constant speed so that 400 Hz. fixed frequency AC power is obtained. If desired, a wider frequency range of, for example, 380–760 Hz. may be obtained from the generators 16a and/or 16b, if advantageous to the APU 22.

It should be noted that a different number of generators (i.e. one or more than two) may be coupled to each prime mover 18–22, if desired. In addition, additional or fewer loads may be supplied power by the system 10.

External power may be obtained from one or more external power sources, here represented by first and second power sources 34a, 34b. The first power source 34a may develop AC power at, for example, 400 Hz., which is converted by the power conversion system 10 (if necessary) for one or more of the loads coupled to the load buses LB1–LB11. The second power source 34b may develop AC power at 50/60 Hz. for starting, as noted in greater detail hereinafter.

The power conversion system 10 further includes a source switch matrix 40, a number of multi-purpose converter units 42 and a load switch matrix 44. In the preferred embodiment, there are six multi-purpose converter units 42a–42f, although a different number of such converter units may be used instead.

As noted in greater detail hereinafter, the source switch matrix 40 and/or the load switch matrix 44 may be implemented by conventional contactors of the single throw variety, double throw center off or special varieties.

Each converter unit has protection and built-in-test functionality as well as a local control for operating switches therein such that appropriately conditioned power is developed thereby. The local controls are commanded by a control unit 45, which also includes a contactor control for the contactors in the matrices 40 and 44. The control unit 45 may be a stand-alone device with built in redundancy, or may be implemented in a utility management system redundant computer.

It should be noted that the multi-purpose converter units may or may not be identical to one another. If no DC loads are to be supplied, and if starting power is not to be supplied by a DC source, then the converter units 42a–42f may all be identical. On the other hand, if DC loads are to be supplied and/or if starting power is to be obtained from a battery or other DC source, then at least one, and possibly two (or more) of the converter units 42 are preferably of a first design, whereas the remaining converter units are preferably of a second design.

During operation in a starting mode, power from any source can be made available through any one of the converters to start either engine 18, 20 or the APU 22. Significantly, redundancy is built into the system so that more than one multi-purpose converter 42 would have to fail before engine start was not possible.

One possible start sequence is to start the APU 22 using power supplied by a battery or power from one of the external power sources 34a, 34b. In this case, the battery power or external power is converted, if and as necessary, by one of the power converter units 42 into appropriately conditioned power which is supplied by the load switch matrix 44 and the source switch matrix 40 to one of the generators 16a, 16b. The generator 16a or 16b is then operated as a starting motor to bring the APU 22 up to self-sustaining speed. Preferably, although not necessarily, the generator power ratings are such that one of the generators can supply sufficient motive power for starting. Either or both of the generators 16a, 16b are thereafter operated to provide power to one or more of the multi-purpose converter units 42a–42f. The converter unit(s) 42a–42f deliver appropriately conditioned power via the load switch matrix 44 and the source switch matrix 40 to one of the generators 12a, 12b and then sequentially thereafter to one of the generators 14a, 14b to cause such generators to operate as motors and sequentially bring the associated engines 18, 20 up to self-sustaining speed. The engines 18, 20 are started sequentially rather than simultaneously owing to power limitations.

Instead of obtaining power for starting of the engines 18, 20 from the generators 16a, 16b, power may instead by obtained from any power source, such as the external power sources 34a or 34b and, in the case of the APU only, a battery.

Once the engines are started, operation in a generating mode can commence wherein power developed by the generators 12, 14 and/or 16 is provided by the source switch matrix 40 to the power converter units 42a–42f. The units 42a–42f, in any order or any combination, can provide power to one or more of the loads via the load switch matrix 44, as desired. During operation in the generating mode, variable frequency power may also (or alternatively) be provided directly to the variable frequency load buses LB9 and LB10 from one or more of the generators 12a, 12b, 14a and 14b via the switch matrices 40, 44.

Figure 2:
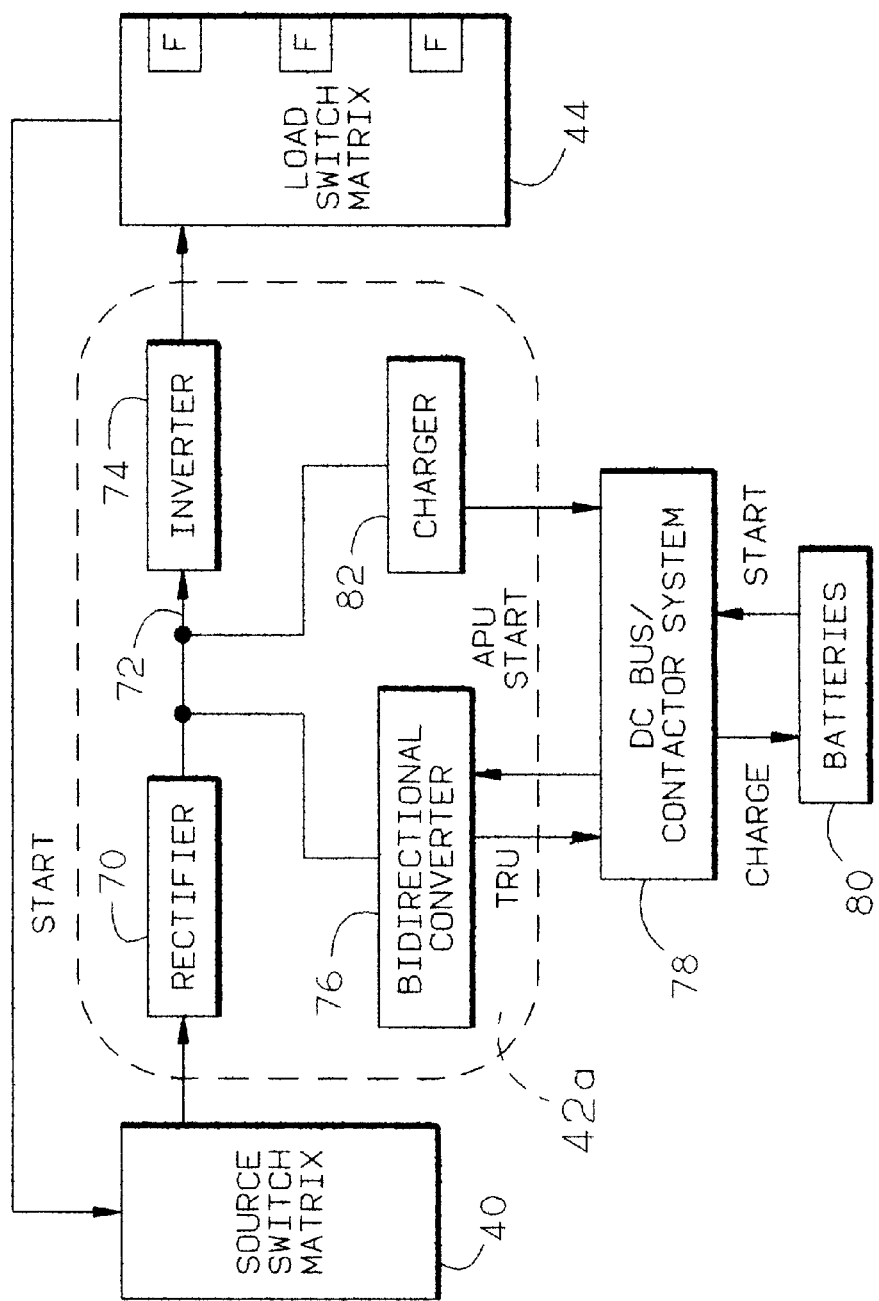
FIG. 2 comprises a block diagram illustrating one of the power converters of FIG. 1 in greater detail.

FIG. 2 illustrates one of the multi-purpose converter units 42 in greater detail. In the preferred embodiment, at least one, and perhaps two or more of the power converter units 42a–42f are of the design illustrated in FIG. 2, such number being determined by the required redundancy level as well as the required DC load handling capability and/or DC power starting requirements. Also shown in FIG. 2 are the source switch matrix 40 and the load switch matrix 44.

It should be understood that each of the switch matrices 40, 44 can include appropriate filtering for EMI suppression. Also, the load switch matrix 44 preferably includes filters for conditioning the power provided to each of the load buses LB1–LB11 as required. These filters are of conventional design and hence are not described further herein.

The multi-purpose converter unit 42a includes a rectifier circuit 70 which is coupled to a DC link 72. The rectifier circuit 70 rectifies the polyphase power provided by the switch matrix 40 and develops DC voltage at a level of, for example, approximately 270 volts on the DC link 72. An inverter 74 converts the DC power into AC power and delivers same to the load switch matrix 44. If the inverter 74 is to supply either or both of the constant frequency buses LB7 and LB8, the inverter 74 develops such constant frequency power. On the other hand, if the inverter 74 is to operate the loads coupled to the load buses LB1–LB6, the inverter 74 develops motor drive waveforms for such loads in a fashion evident to one of ordinary skill in the art. When power is to be provided to one or more of the generators 12, 14 and 16 for starting as a motor, the inverter 74 develops AC power which is suitable for such function.

A bidirectional converter 76 is coupled to the DC link 72 and a DC bus/contactor system 78 is coupled to the bidirectional converter 76. The DC bus/contactor system 78 is further coupled to one or more batteries 80 and a charger 82, wherein the latter is also coupled to the DC link 72.

The bidirectional converter 76 shifts the level of the voltage on the DC link to a lower level of, for example, 28 volts DC, thereby accomplishing the function of a conventional transformer-rectifier unit (TRU). DC power is thus made available for DC loads over the DC bus/contactor system 78 during operation in the generating mode. In addition, battery charging may be accomplished by the battery charger 82 during operation in the generating mode. In this manner, independent control over the output voltage of the converter 76 and the battery charging function is possible. If desired, the TRU function and the battery charging function can be combined in a single unit.

During a normal start sequence without external power, the batteries 80 provide DC power to the DC bus/contactor system 78 and the bidirectional converter 76 is operated to develop 270 volt DC power on the DC link 72. The DC power is converted into AC power suitable for APU starting by the inverter 74. The AC power is supplied by the load switch matrix 44 to the source switch matrix 40 and thence to the appropriate generator 16.

The remaining converters 42 other than those of the design shown in FIG. 2 preferably (although not necessarily) comprise only the rectifier circuit 70 and the inverter 74 coupled to the rectifier circuit 70. The remaining elements 76, 78, 80 and 82 of FIG. 2 are omitted.

Preferably, no more than the required number of converters 42a–42f are of the design shown in FIG. 2 so that appropriate redundancy levels are met without unduly adding to system size and weight.

By providing two or more generators per engine, each of which is capable of providing sufficient motive power to start the associated engine 18, 20 or 22, a level of redundancy is achieved which allows minimum equipment lists for dispatch (MELD) requirements to be met even with a failed generator, while still providing sufficient power as required by loads.

Figure 3:
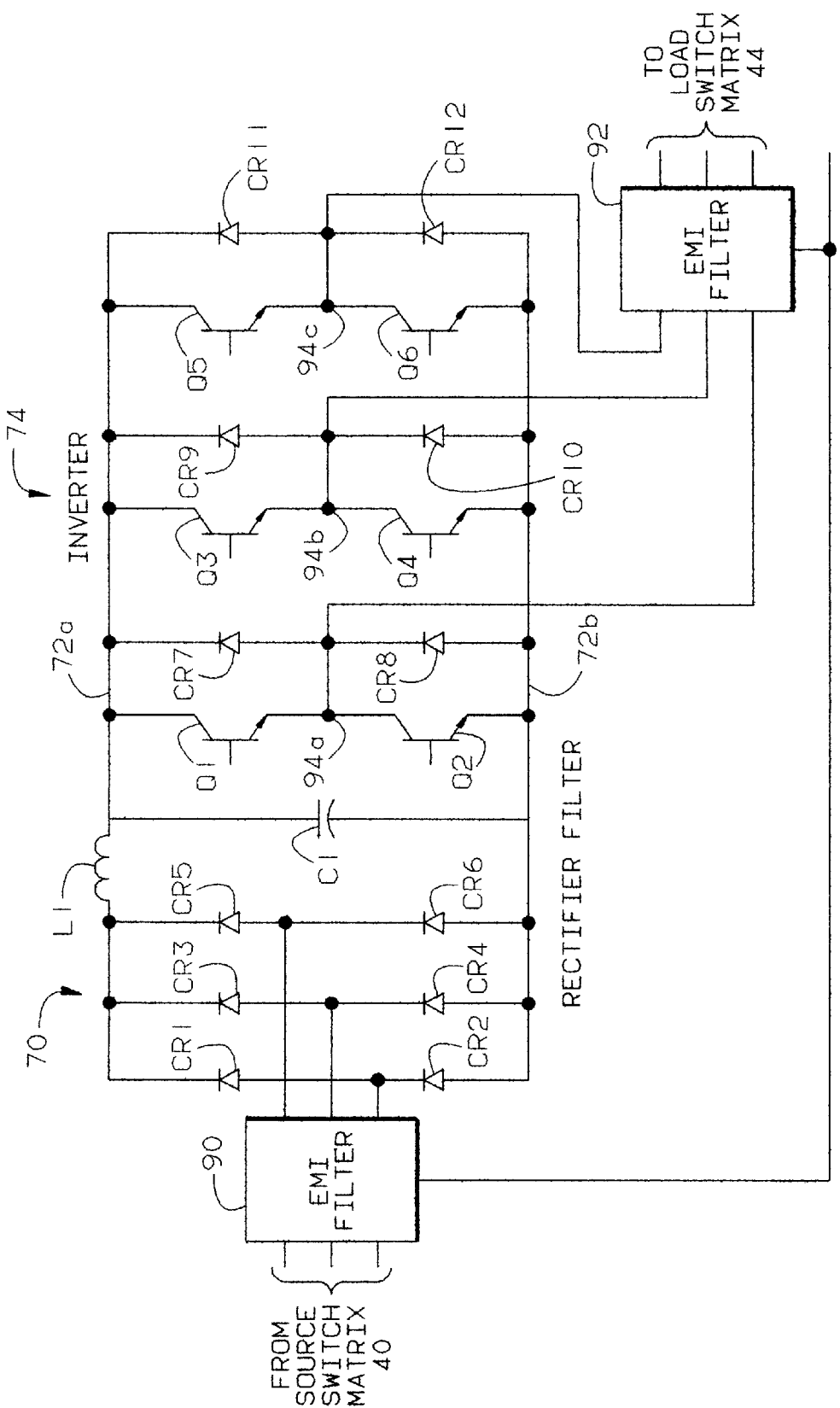
FIG. 3 comprises a simplified schematic diagram of the rectifier circuit and inverter of FIG. 2.

FIG. 3 illustrates the rectifier 70 and the inverter 74 in greater detail. The rectifier circuit 70 includes six diodes CR1–CR6 connected in a conventional three-phase bridge configuration between an EMI filter 90 and a DC filter comprising an inductor L1 and a capacitor C1. DC link conductors 72a and 72b forming the DC link 72 are connected across the capacitor C1 and are further coupled to controllable power switches Q1–Q6 and associated flyback diodes CR7–CR12 connected in a conventional three-phase bridge configuration to form the inverter 74. An output EMI filter 92 is coupled to phase outputs 94a–94c of the inverter 74. The inverter switches Q1–Q6 are operated by the local control unit of the inverter in a mode commanded by the control unit.

Figure 4:
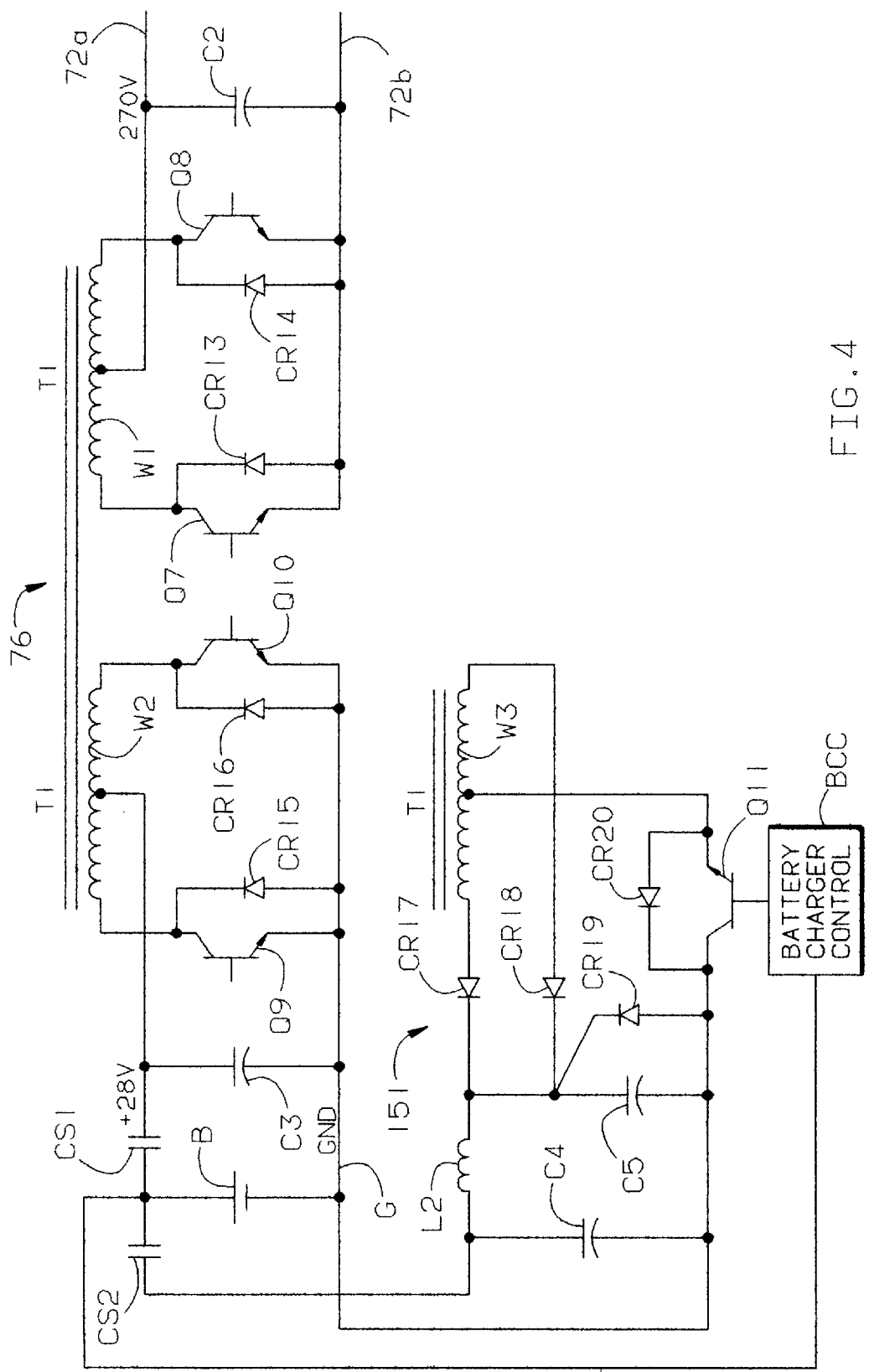
FIG. 4 is a simplified schematic diagram of the bidirectional converter of FIG. 2.

FIG. 4 illustrates the bidirectional converter 76 in greater detail. In this embodiment, the battery charger is incorporated into the bidirectional converter together with one or more batteries and contactors as required. The bidirectional DC-DC converter 76 includes a capacitor C2 coupled across DC link conductors 72a, 72b forming the DC link of 72 of FIG. 2. A transformer T1 includes first through third windings W1–W3. Ends of the winding W1 are coupled to controllable switches Q7, Q8 and associated flyback/rectifier diodes CR13, CR14, respectively. A midtap of the winding W1 is coupled to the conductor 72a while the conductor 72b is coupled to the controllable switches Q7, Q8 and the diodes CR13, CR14.

Ends of the winding W2 are coupled to controllable switches Q9, Q10 and associated flyback/rectifier diodes CR15, CR16. A midtap of the winding W2 is coupled to one end of a capacitor C3 and thence by contacts of a contactor set CS1 to a battery B. A ground conductor G is coupled to another end of the battery B and further is coupled to the emitters of the controllable switches Q9, Q10.

It should be noted that the controllable switches Q7–Q10 may comprise power transistors or other switching devices of suitable power rating, including IGBT's, power MOSFET's or the like.

A further contactor set CS2 interconnects the high voltage terminal of the battery B with a battery charger circuit including a battery charger control BCC which operates a power transistor Q11, the winding W3 of the transformer T1, diodes CR17–CR20 and energy storage elements comprising capacitors C4, C5 and an inductor L2. The battery charger control BCC operates the power transistor Q11 at a switching rate determined by the voltage on the battery B to control the rectified power delivered thereto.

As noted above, the source switch matrix 40 and the load switch matrix 44 may comprise a series of conventional contactors which are interconnected to accomplish the switching functions described herein. Such design using discrete contactor sets is well within the capability of one of ordinary skill in the art. Alternatively, devices like the contactor device 100 shown in FIGS. 5–7 may be used in the system of FIG. 1 as the source switch matrix 40 and/or the load switch matrix 44.

Figure 5:
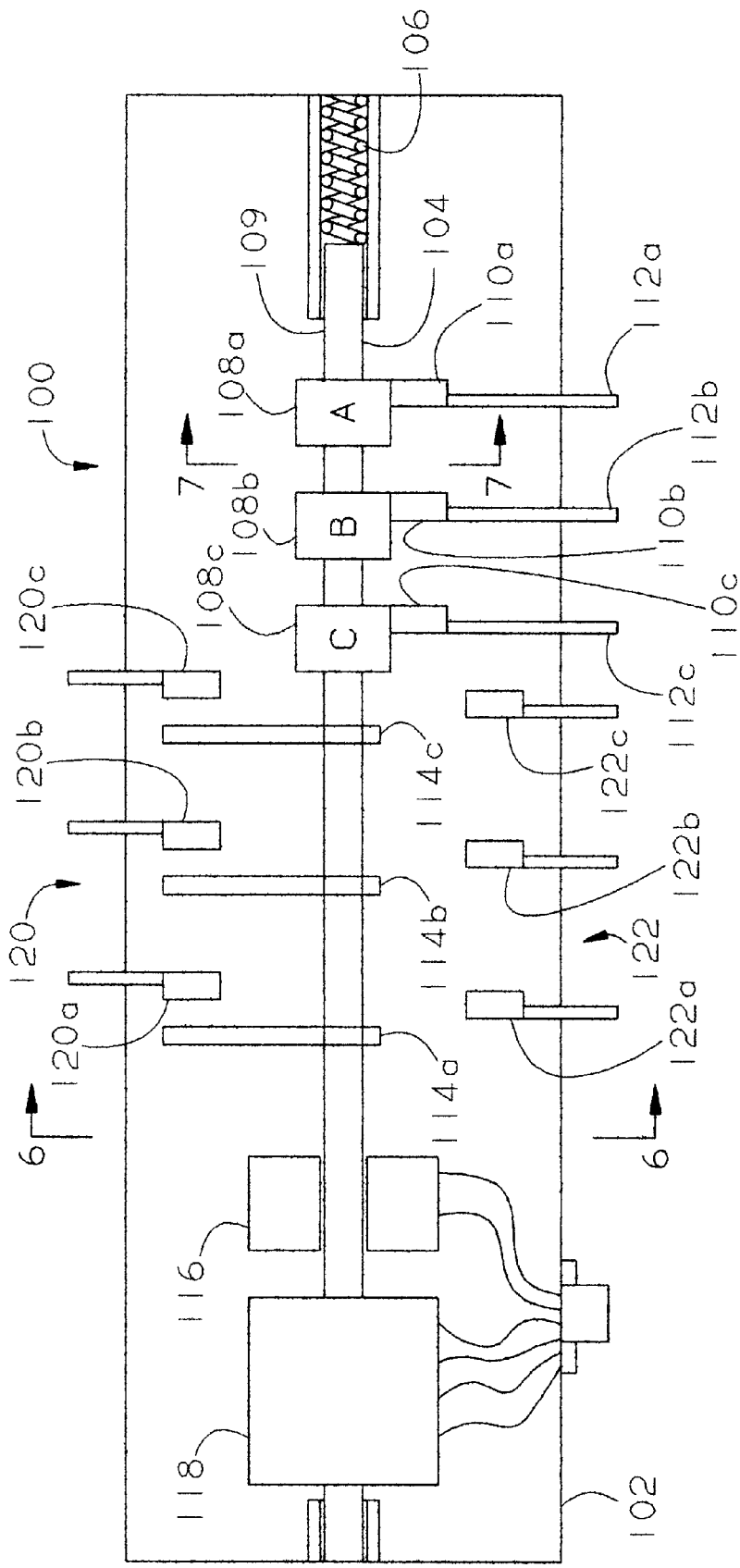
FIG. 5 is a diagrammatic illustration of an exemplary contactor apparatus which may be utilized as the source switch matrix or the load switch matrix of FIG. 1.

The device 100 includes a housing 102 within which is disposed a rotor 104 journaled for rotation therein. A spring 106 biases the rotor 104 to the left as seen in FIG. 5.

The rotor 104 includes first through third slip rings 108a, 108b and 108c mounted on a rotor shaft 109 and which are contacted by brushes 110a, 110b and 110c, respectively. Conductors 112a, 112b and 112c are coupled to the brushes 110a, 110b and 110c, respectively, and extend outwardly of the housing 102.

Figure 7:
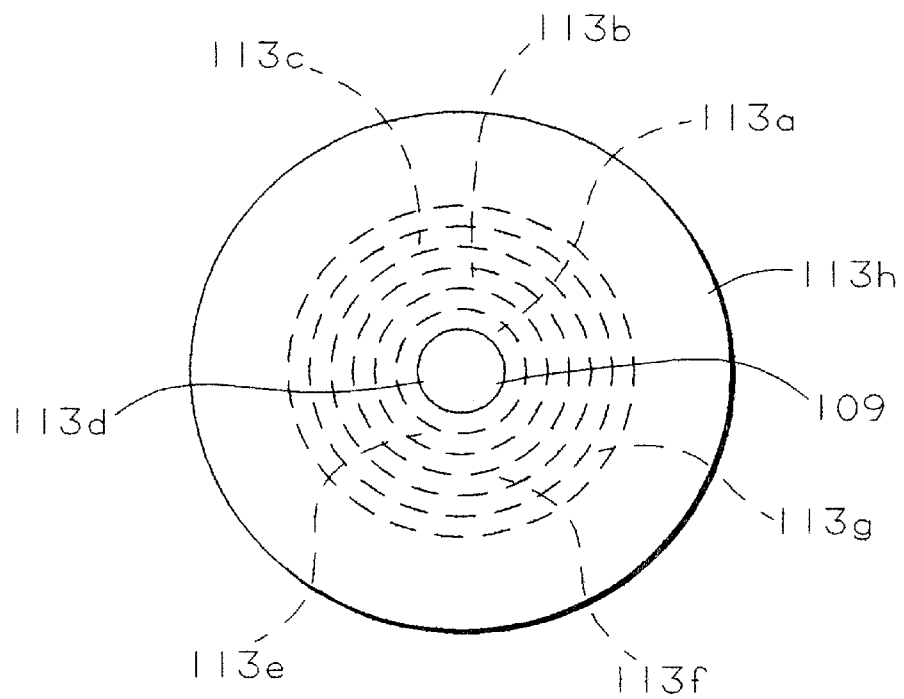
FIG. 7 is a sectional view taken generally along the lines 7—7 of FIG. 6.

Referring to FIG. 7, the shaft 109 comprises a series of concentric electrically conductive portions 113a, 113b and 113c, which may be made of copper or any other suitable material, separated by concentric electrically insulative portions 113d, 113e, 113f, 113g, which may be fabricated of ceramic or any other suitable material. The slip ring 108a is electrically connected to the electrically conductive portion 113a by an electrically conductive disk portion 113h carried at an axial end of the slip ring 108a. The disk portion 113h is embedded within the rotor shaft 109 and is electrically isolated from the electrically conductive portions 113b, 113c by electrically insulating portions (not shown) covering axial faces of the disk portion 113h except where the portion 113h is joined to the slip ring 108a and the portion 113a. Identical axially spaced electrically conductive disk portions (not shown) interconnect the slip ring 108b only with the electrically conductive portion 113b and the slip ring 108c only with the electrically conductive portion 113c.

First through third angularly aligned rotor contacts 114a–114c are carried by the rotor shaft 109. Each contact 114a, 114b, 114c is exclusively coupled to an electrically conductive portion 113a, 113b, 113c, respectively, by an electrically conductive disk portion similar or identical to the portion 113h described above. A solenoid 116 is operable to force the rotor 104 to the right as seen in FIG. 5 against the force of the spring 106. A stepper motor 118 is also coupled to the rotor 104 and is operable to control the angular position of the contacts 114a–114c.

The device 100 further includes a plurality of contactor sets carried by the housing 102. In the example shown in FIGS. 5 and 6, there are four housing contactor sets, each containing three angularly aligned contacts, of which two contactor sets 120 and 122 are visible in FIG. 5. Each contactor set 120, 122 comprises three contacts 120a–120c and 122a–122c, respectively, which are located at positions diametrically opposed from one another. As seen in the diagrammatic view of FIG. 5, the contactor set 120 is located at the twelve o'clock position whereas the contactor set 122 is located at the six o'clock position. Additional contactor sets 124, 126 (of which only one contact each is visible) are located at the three o'clock position and the nine o'clock position. Other contactor sets may be similarly disposed at other positions angularly spaced about the housing 102, as necessary.

Figure 6:
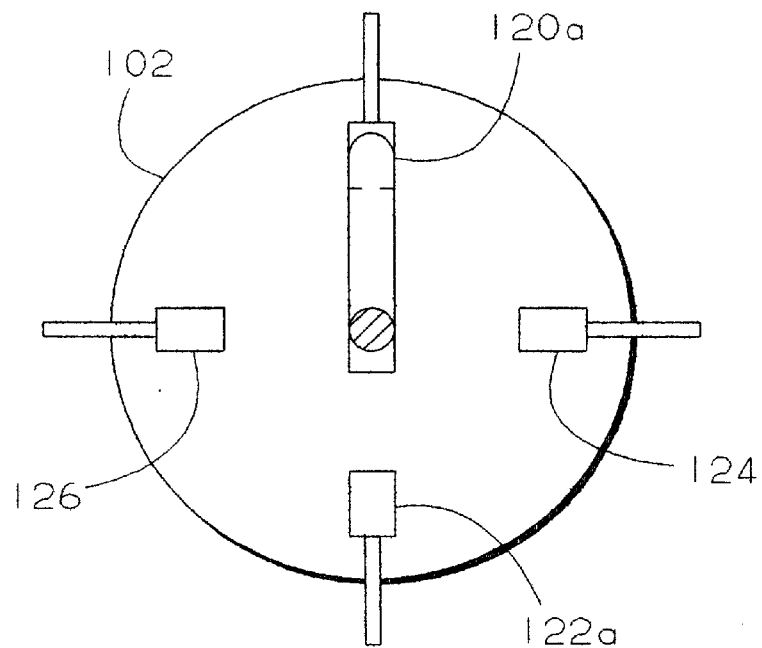
FIG. 6 is a diagrammatic sectional view of the apparatus of FIG. 5 taken generally along the lines 6—6 of FIG. 5.
Figure 8:
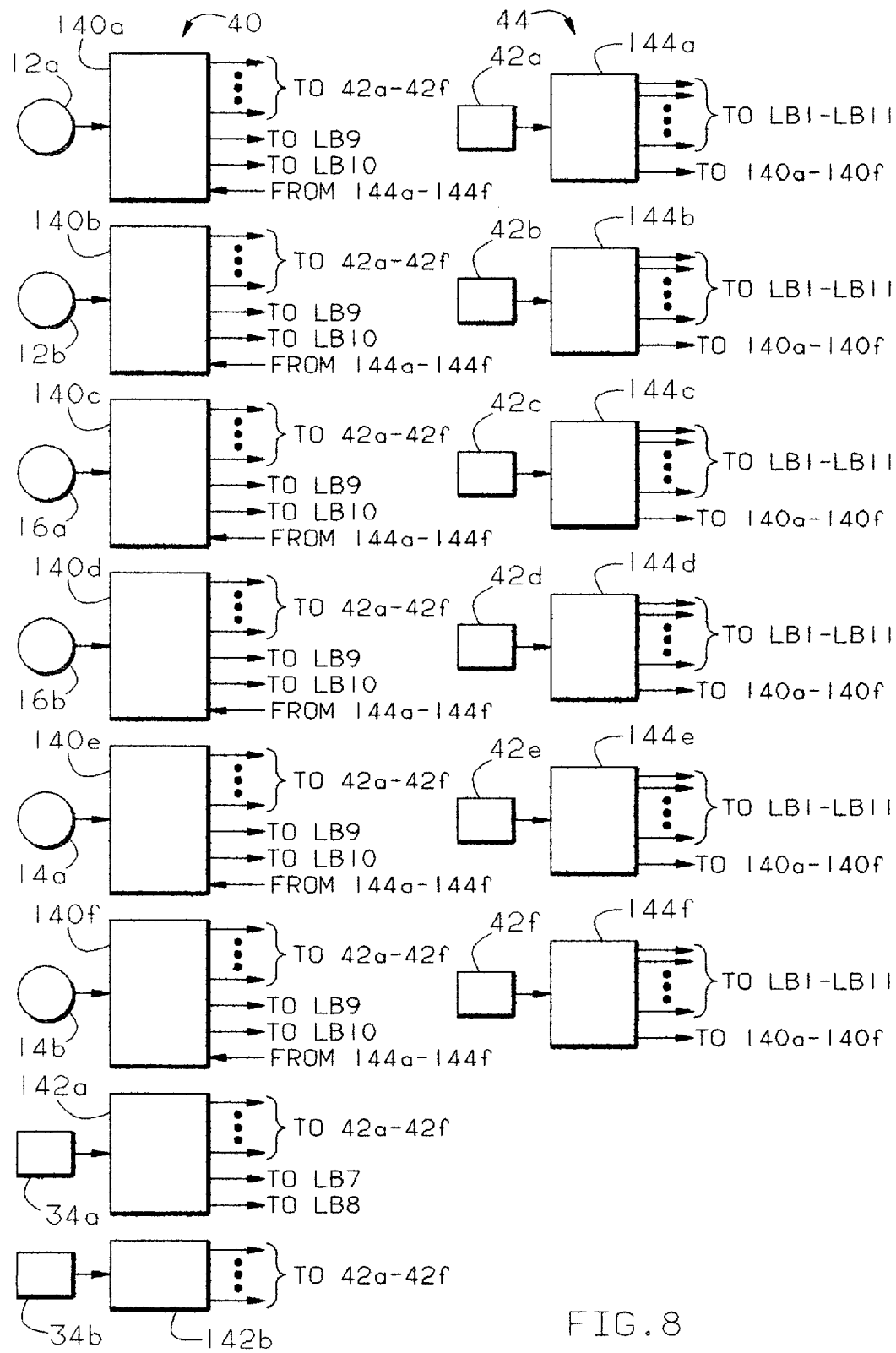
FIG. 8 is a block diagram illustrating the system of FIG. 1 in greater detail.

FIG. 8 illustrates the system of FIG. 1 in greater detail wherein the source switch matrix 40 and the load switch matrix 44 include devices like the device 100 of FIGS. 5–7 to accomplish the switching function. More particularly, the source switch matrix 40 includes contactor devices 140a–140f and 142a, 142b whereas the load switch matrix 44 includes contactor devices 144a–144f. Each of the devices 140–144 is identical to the device 100 shown in FIGS. 5–7 with the exception of the number of housing contactor sets in each. Specifically, each of the devices 140a–140f includes nine angularly-spaced housing contactor sets wherein six of such sets are connected to the inputs of the power converter units 42a–42f and wherein two of the remaining sets are coupled to the variable frequency load buses LB9 and LB10. The remaining housing contactor sets are all coupled to a housing contactor set of each of the devices 144a–144f.

The brushes of the devices 140a–140f are coupled to the phase outputs of the generators 12a, 12b, 14a, 14b, 16a, 16b, respectively.

Each of the devices 142a, 142b includes brushes corresponding to the brushes 110a–110c of FIG. 5 which are coupled to outputs of the external power sources 34a, 34b. The devices 142a, 142b include eight and six angularly-spaced housing contactor sets, respectively. Six of the contactor sets of the device 142a and the six contactor sets of the device 142b are coupled to inputs of the converters 42a–42f. The remaining two contactor sets of the device 142a are coupled to the load buses LB7 and LB8.

Each of the devices 144a–144f includes brushes corresponding to the brushes 110a–110c of FIG. 5 which are coupled to phase outputs of the converters 42–42f. Each device 144a–144f includes twelve housing contactor sets wherein 11 of the sets are coupled to the load buses LB1–LB11. The remaining contactor set of each device is coupled to each of the devices 140a–140f.

In operation, the stepper motor and the solenoid of each device 140–144 are operated by the control unit 45 to connect the rotor contacts of such device to the appropriate housing contactor set. Thus, for example, the converter 42a may be coupled to one of the load buses LB1–LB11 by the device 144af to supply appropriately conditioned power thereto. Alternatively, the power converter 42a may be coupled by the device 144a to the device 140a, and thence may be coupled to the generator 12a to supply starting power.

As a further example, variable frequency power developed by the generator 14a may be supplied by the device 140e to either of the variable frequency load buses LB9, LB10. As a still further alternative, such power may instead be supplied to any one of the power converters 42a–42f by the device 140e.

If desired, one or more additional contactors could be added to either or both of the source switch matrix 40 and the load switch matrix 44 to allow connection of multiple load buses and/or converters to one or more generators.

In yet another possible scenario, fixed frequency power from the external power source 34a may be supplied to any one of the power converters 42a–42f or to the 400 Hz. fixed frequency load buses LB7 or LB8.

The particular connections to deliver power as needed in the power supply system of the present invention and the controls for operating the devices 144a–144f is evident to one of ordinary skill in the art in view of the foregoing description.

The system of the present invention provides for redundant starting and generating operation, and further reduces system size and weight. Further, reliability is improved through the elimination of the DC machine coupled to the APU.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights of all modifications which come within the scope of the appended claims are reserved.

What is claimed is:

1. A power conversion system, comprising:

first and second prime movers;

first and second pairs of generators coupled to the first and second prime movers, respectively;

a load bus;

a power source; and a power converter interconnecting the generators, the load bus and the power source and operable in a starting mode of operation such that power from the power source is conditioned and supplied to one of the generators of the first pair of generators to cause the one generator to operate as a motor and start the first prime mover and the power converter being subsequently operable to provide power from the one generator to a generator of the second pair of generators to cause such generator to operate as a motor and thereby start the second prime mover.

2. The power conversion system of claim 1, wherein power for the generator of the second pair of generators is developed by the one generator of the first pair of generators.

3. The power conversion system of claim 1, wherein power for the generator of the second pair of generators is developed by the power source.

4. The power conversion system of claim 1, wherein the power converter is further operable in a generating mode to condition power developed by at least one of the generators and to deliver such conditioned power to the load bus.

5. The power conversion system of claim 1, wherein the prime movers comprise aircraft engines.

6. The power conversion system of claim 1, wherein the power source comprises a battery.

7. The power conversion system of claim 1, wherein the power source comprises an AC power source.

8. The power conversion system of claim 1, wherein the load bus receives variable frequency power from at least one of the generators.

9. The power conversion system of claim 1, wherein the power converter comprises a plurality of identical power converter units and further including additional load buses, a first switch matrix coupled between the generators and the power converter units and a second switch matrix coupled between the power converter units and the load buses.

10. The power conversion system of claim 9, wherein the power source comprises a battery and each power converter unit comprises a rectifier circuit coupled between the first switch matrix and a DC link and an inverter coupled between the DC link and the second switch matrix.

11. The power conversion system of claim 9, wherein each of the first and second switch matrices comprises a rotary device including a housing having a plurality of sets of housing contacts and a rotor having a set of rotor contacts selectively engageable with one of the sets of housing contacts.

12. A power conversion system for an aircraft, comprising:

first and second aircraft engines;

an auxiliary power unit (APU);

first and second pairs of generators coupled to the first and second aircraft engines, respectively, and a third pair of generators coupled to the APU;

a first load bus coupled to an electrically driven hydraulic pump;

a second, variable frequency bus;

a first switch matrix coupled to the generators;

first through sixth power converter units coupled to the first switch matrix;

a second switch matrix coupled between the first through sixth power converter units and the load buses; and a control operable in a starting mode to cause at least one of the power converter units to provide conditioned power to at least one of the generators to cause the at least one generator to operate as a motor and start the APU or the aircraft engine coupled thereto and subsequently operable to cause the at least one of the power converter units to provide power selectively to each of the remaining generators to cause the remaining generators to operate as motors and thereby start the APU and/or aircraft engines coupled thereto and further operable in a generating mode to provide power developed by one or more of the generators to the load buses.

13. The power conversion system of claim 12, wherein power for the remaining generators is developed by the at least one generator.

14. The power conversion system of claim 12, wherein power for the remaining generators is developed by the power source.

15. The power conversion system of claim 12, wherein the control comprises a contactor control for the first and second switch matrices.

16. The power conversion system of claim 15, wherein the power converter units are identical to one another.

17. The power conversion system of claim 12, wherein each of the first and second switch matrices comprises a rotary device including a stator having a plurality of sets of stator contacts and a rotor having a set of rotor contacts selectively engageable with one of the sets of stator contacts.

18. The power conversion system of claim 12, wherein each power converter unit comprises a rectifier circuit coupled between the first switch matrix and a DC link and an inverter coupled between the DC link and the second switch matrix.

19. A power conversion system for an aircraft having first and second pairs of generators coupled to first and second aircraft engines, respectively, and a third pair of generators coupled to an auxiliary power unit (APU) wherein the aircraft further includes a first set of load buses coupled to electrically driven hydraulic pumps, a second set of load buses coupled to variable frequency loads and a DC bus coupled to DC loads, comprising:

a first switch matrix coupled to the generators;

identical first through sixth power converter units coupled to the first switch matrix;

a second switch matrix coupled between the first through sixth power converter units and the first and second sets of load buses; and a control for controlling the first and second switch matrices and the power converter units and operable in a starting mode to cause at least one of the power converter units to provide conditioned power to one of the generators to cause the one generator to operate as a motor and start the APU or the aircraft engine coupled thereto and subsequently operable to cause the at least one of the power converter units to provide power developed by the one generator selectively to each of the remaining generators to cause the remaining generators to operate as motors and thereby start the APU and/or aircraft engines coupled thereto and further operable in a generating mode to provide conditioned AC power to the first set of load buses, variable frequency AC power to the second set of load buses and DC power to the DC bus;

wherein each power converter unit comprises a rectifier circuit coupled between the first switch matrix and a DC link and an inverter coupled between the DC link and the second switch matrix.

20. The power conversion system of claim 19, wherein each of the first and second switch matrices comprises a rotary device including a stator having a plurality of sets of stator contacts and a rotor having a set of rotor contacts selectively engageable with one of the sets of stator contacts.

* * * * *